United States Patent
Huang et al.

(10) Patent No.: US 8,520,391 B2
(45) Date of Patent: Aug. 27, 2013

(54) INNER-LAYER HEAT-DISSIPATING BOARD, MULTI-CHIP STACK PACKAGE STRUCTURE HAVING THE INNER LAYER HEAT-DISSIPATING BOARD AND FABRICATION METHOD THEREOF

(75) Inventors: Huei-Nuan Huang, Taichung (TW); Pin-Cheng Huang, Taichung (TW); Chun-Hung Lu, Taichung (TW); Chun-Chieh Chao, Taichung (TW); Chi-Hsin Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 280 days.

(21) Appl. No.: 13/112,253

(22) Filed: May 20, 2011

(65) Prior Publication Data

US 2012/0224328 A1    Sep. 6, 2012

(30) Foreign Application Priority Data

Mar. 2, 2011  (TW) .............................. 100106829 A

(51) Int. Cl.
*H05K 7/20*    (2006.01)

(52) U.S. Cl.
USPC ........... 361/709; 361/704; 361/707; 361/710; 361/711; 361/712; 257/706; 257/707; 165/185

(58) Field of Classification Search
None
See application file for complete search history.

(56) References Cited

U.S. PATENT DOCUMENTS

| | | | |
|---|---|---|---|
| 7,112,472 B2 * | 9/2006 | Dubin | 438/122 |
| 7,504,453 B2 * | 3/2009 | Hu et al. | 524/495 |
| 7,538,422 B2 * | 5/2009 | Dangelo et al. | 257/706 |
| 8,106,510 B2 * | 1/2012 | Altman et al. | 257/739 |

* cited by examiner

*Primary Examiner* — Boris Chervinsky
(74) *Attorney, Agent, or Firm* — Edwards Wildman Palmer LLP; Peter F. Corless; Steven M. Jensen

(57) ABSTRACT

An inner-layer heat-dissipating board and a multi-chip stack package structure having the inner-layer heat-dissipating board are disclosed. The inner-layer heat-dissipating board includes a metal board body formed with a plurality of penetrating conductive through holes each comprising a plurality of nano wires and an oxidative block having nano apertures filled with the nano wires. The multi-chip stack package structure includes a first chip and an electronic component respectively disposed on the inner-layer heat-dissipating board to thereby facilitate heat dissipation in the multi-chip stack structure as well as increase the overall package rigidity.

15 Claims, 4 Drawing Sheets

US 8,520,391 B2

INNER-LAYER HEAT-DISSIPATING BOARD, MULTI-CHIP STACK PACKAGE STRUCTURE HAVING THE INNER LAYER HEAT-DISSIPATING BOARD AND FABRICATION METHOD THEREOF

This application claims under 35 U.S.C. §119(a) the benefit of Taiwanese Application No. 100106829, filed Mar. 2, 2011, the entire contents of which is incorporated herein by reference.

BACKGROUND OF THE INVENTION

1. Field of the Invention

This invention relates to an inner-layer heat-dissipating board, a multi-chip stack package structure having the inner-layer heat-dissipating board and a fabrication method thereof, and, more particularly, to a multi-chip stack package structure that provides a heat-dissipating path and increases the overall structural rigidity in an stacked structure and a fabrication method thereof.

2. Description of Related Art

With the rapid development of technology, a variety of novel products constantly come to the market. These products are designed to be increasingly low-profiled and compact sized, so as to meet the consumers' demands for ease of use and portability.

In addition to the characteristics of being low-profile and compact in size, modern electronic products are preferred to have high efficiency, low power consumption and high functionality as well. Accordingly, manufactures have developed a technique to dispose a plurality of semiconductor chips on a circuit board or a packing substrate, in order to increase the electrical functionality. However, only a limited number of semiconductor chips can be disposed on a single packaging substrate, in that the packaging substrate does not have a large enough area. Moreover, the planer disposition of the semiconductor chips on the packaging substrate is contradictory to the requirements of having a low-profile and compact size. To address this problem, a package structure has been designed to have a plurality of semiconductor chips stacked on one another. Such a package structure having the semiconductor chips stacked has a short transmission path, and characteristics of high efficiency, low power consumption and high functionality. Compared to the conventional package structure in which a plurality of semiconductor chips are disposed on a packaging substrate one by one, the package structure in which the semiconductor chips are stacked on one another may dramatically reduce the area of the packaging substrate.

Referring to FIG. 1, a multi-chip stack package structure is shown according to the prior art. A first semiconductor chip 11 is electrically connected through solder balls 110 to a packaging substrate 10. A second semiconductor chip 12 is stacked on the first semiconductor chip 11. A third semiconductor chip 13 is stacked on the second semiconductor chip 12. The second semiconductor chip 12, and the third semiconductor chip 13 are electrically connected to the packaging substrate 10 by solder wires 14 in a wire bonding manner.

However, the second semiconductor chip 12 has to be smaller than the first semiconductor chip 11 and the third semiconductor chip 13 also has to be smaller than the second semiconductor chip 12, such that the first and second semiconductor chips 11 and 12 may provide an area on top for the solder wires 14 to be bonded thereon. As a result, a limited number of semiconductor chips may be installed on the packaging substrate. On the other hand, the solder wires 14 are in the shape of an arc, which also limits the reduction of the volume of the package structure.

In order to solve the problems, enhance the electrical functionality and transmission efficiency, and meet the trends toward functional integration, semiconductor manufacturers have developed a technique that vertically stack on a packaging substrate a plurality of semiconductor chips each of which has through-silicon vias (TSVs) in which a conductive material is filled, to constitute a semiconductor package structure. The semiconductor package structure not only has good electrical functionality and enhanced electrical transmission efficiency, but can also meet the demands of high-end electronic products.

Referring to FIG. 2A, a multi-chip stack package structure with TSVs is shown. A plurality of TSV chips 21 are stacked on and electrically connected to a packaging substrate 20 by solder balls 201. A semiconductor chip 22 is disposed on the very top one of the TSV chips 21.

However, heat generated by the TSV chips 21, particularly those disposed in the middle of the stack, is difficult to dissipate to a region outside of the stack, since the gaps between any two adjacent ones of the TSV chips 21 are very small. If the temperature goes too high, it may severely impact the operation of the TSV chips 21, or even damage the TSV chips 21.

To address the above problem, a metal heat-dissipating sheet 23 is further adhered to a surface of the semiconductor chip 22 that is exposed to air, as shown in FIG. 2B. As a result, heat generated by the TSV chips 21 disposed in the middle of the stack may be dissipated through a conductive material such as the solder balls 201 and the TSVs to the metal heat-dissipating sheet 23.

However, heat generated by the TSV chips 21 in the middle of the stack needs to travel a long path to arrive at the metal heat-dissipating sheet 23, which reduces the heat-dissipating efficiency. Moreover, the metal heat-dissipating sheet 23 that is disposed on the semiconductor chip 22 should not have an area much greater than that of the semiconductor chip 22, or adherence and stress problems may occur, and the semiconductor chip 22 may be easily broken.

Therefore, finding a way to provide an inner layer heat-dissipating board, a multi-chip stack package structure having the inner layer heat-dissipating board and fabrication method thereof is becoming one of the most popular issues in the art.

SUMMARY OF THE INVENTION

In view of the above-mentioned problems of the prior art, the present invention provides an inner-layer heat-dissipating board, comprising: a metal board body; and a plurality of conductive through holes penetrating the metal board body, each of the conductive through holes including a plurality of nano wires and an oxidative block having a plurality of nano apertures filled with the nano wires.

The metal board body may be made of aluminum, and the oxidative block may be made of aluminum oxide.

The inner-layer heat-dissipating board may further include a plurality of first bumps disposed on end surfaces of the conductive through holes.

Each of the nano wires may have a width less than or equal to 100 nano meters, or have an aspect ration greater than 1000. The nano wires may be made of metal, such as copper, nickel, platinum or gold.

The present invention further provides a multi-chip stack package structure, comprising: an inner-layer heat-dissipating board including a metal board body and a plurality of conductive through holes penetrating the metal board body, each of the conductive through holes including a plurality of nano wires and an oxidative block having a plurality of nano apertures filled with the nano wires; a first chip disposed on a first surface of the inner-layer heat-dissipating board; and an electronic component disposed on a second surface of the inner-layer heat-dissipating board, the second surface opposing the first surface.

The electronic component may be a circuit board or a second chip.

The first chip and the electronic components have a plurality of second bumps disposed thereon electrically connected to the first bumps via the second bumps.

In the multi-chip stack package structure, the electronic component may be a second chip disposed on the inner-layer heat-dissipating board via a top surface thereof, and the multi-chip stack package structure further comprises a circuit board disposed under a bottom surface of the second chip.

The multi-chip stack package structure may further comprise an underfill material formed between the inner-layer heat-dissipating board and the first chip, between the inner-layer heat-dissipating board and the second chip and between the circuit board and the second chip.

Each of the nano wires may have a width less than or equal to 100 nano meters, or have an aspect ration greater than 1000. The nano wires may be made of metal, such as copper, nickel, platinum or gold.

The present invention further provides a method of fabricating multi-chip stack package structure, comprising: providing an inner-layer heat-dissipating board including a metal board body and a plurality of conductive through holes penetrating the metal board body, each of the conductive through holes including a plurality of nano wires and an oxidative block having a plurality of nano apertures filled with the nano wires; and disposing a first chip on a first surface of the inner-layer heat-dissipating board, disposing an electronic component on a second surface of the inner-layer heat-dissipating board, the second surface opposing the first surface, and electrically connecting the first chip and the electronic component to the conductive through holes.

The conductive through holes may be made by: forming on a surface of the metal board body a resist layer having a plurality of openings, allowing the openings to expose a portion of the metal board body; oxidizing the exposed portion of the metal board body to form oxidative blocks; patterning and etching the oxidative blocks to form the nano apertures in the oxidative blocks; forming the nano wires in the nano apertures; and exposing the oxidative blocks and the nano wires from the metal board body, so as to form the conductive through holes.

The method may further comprise removing the resist layer before or after the oxidative blocks and the nano wires are exposed from the metal board body. Moreover, another surface of the metal board body on which the resist layer is not formed is polished or etched, so as to expose the oxidative blocks and the nano wires. The method may further comprise forming a plurality of first bumps. For instance, the first bumps may be formed on the end surfaces of the conductive through holes before the oxidative blocks and the nano wires are exposed.

In the multi-chip stack package structure, the first chip and the electronic components comprise a plurality of second bumps disposed thereon electrically connected to the first bumps.

In the method of fabricating a multi-chip stack package structure, the first chip and the electronic component are electrically connected to the first bumps through a plurality of second bumps.

The electronic components may be a second chip disposed on the inner-layer heat-dissipating board via a top surface thereof, and the multi-chip stack package structure and the method thereof may further comprise disposing a circuit board under a bottom surface of the second chip.

The method of fabricating the multi-chip stack package structure may further comprises forming an underfill material between the inner-layer heat-dissipating board and the first chip, between the inner-layer heat-dissipating board and the second chip and between the circuit board and the second chip.

In another embodiment of the present invention, a bottom surface of the electronic component is stacked on another inner-layer heat-dissipating board, a bottom surface of the inner-layer heat-dissipating board may be stacked on another electronic component, e.g., a third chip, and a bottom surface of the third chip may be also disposed on the circuit board.

It is known from the above that the multi-chip stack package structure and the fabrication method thereof may provide an inner-layer heat-dissipating board having a metal board body and conductive through holes penetrating the metal board body that are filled with nano wires. Two chips electrically connected to the conductive through holes are disposed on two surfaces of the inner-layer heat-dissipating board, respectively, such that the inner-layer heat-dissipating board is sandwiched between the stacked chips, and provides a fast heat-dissipating path for those of the chips disposed in the middle of the stack. Therefore, the problem of poor heat-dissipating efficiency is solved. Moreover, in the present invention a metal board body having oxidative blocks is used as a heat-dissipating board, and the multi-chip stack package structure thus has an enhanced overall rigidity, lowering the risk of being damaged.

BRIEF DESCRIPTION OF DRAWINGS

The invention can be more fully understood by reading the following detailed description of the preferred embodiments, with reference made to the accompanying drawings, wherein:

FIGS. 2A and 2B are cross-sectional views of a package structure having a plurality of stacked TSV chips according to the prior art, wherein FIG. 2B is another embodiment of FIG. 2A; and FIGS. 3A to 3I are cross-sectional views illustrating embodiments of a method of fabricating an inner-layer heat-dissipating board and a multi-chip stack package structure having the inner-layer heat-dissipating board according to the present invention, wherein FIGS. 3D-1, 3E-1 and 3F-1 are locally enlarged diagrams of FIGS. 3D, 3E and 3F, respectively, and FIG. 3I' is another embodiment of FIG. 3I.

DETAILED DESCRIPTION OF PREFERRED EMBODIMENTS

The following illustrative embodiments are provided to illustrate the present invention and its advantages, these and other advantages and effects being readily understood by those in the art after reading the disclosure of this specification. The present invention can also be performed or applied by different embodiments. The details of the specification are on the basis of specific applications, and numerous modifications and variations can be devised without departing from the spirit of the present invention.

To obtain a multi-chip stack package structure according to the present invention, an embodiment of a method of fabricating an inner-layer heat-dissipating board is shown in FIGS. 3A to 3G according to the present invention.

Figure 3A:
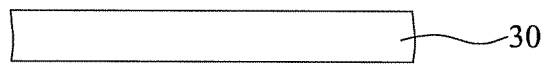

As shown in FIG. 3A, a metal board body 30 made of aluminum, for example, is provided.

Figure 3B:
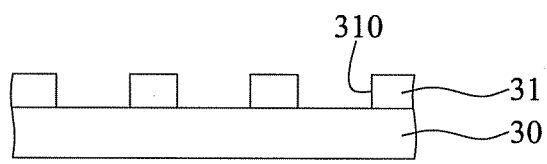

As shown in FIG. 3B, a resist layer 31 is formed on a surface of the metal board body 30, and is patterned to form a plurality of openings 310 that expose a portion of the metal board body 30.

Figure 3C:
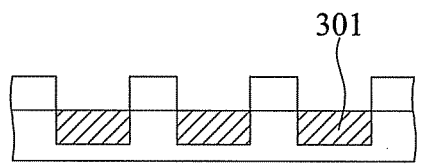

As shown in FIG. 3C, the portion of the metal board body 30 exposed in the openings 310 is oxidized to form a plurality of oxidative blocks 301 that may or may not penetrate into the metal board body 30, as shown in the embodiment. In an embodiment of the present invention, the oxidative blocks 301 are made of aluminum.

Figure 1:
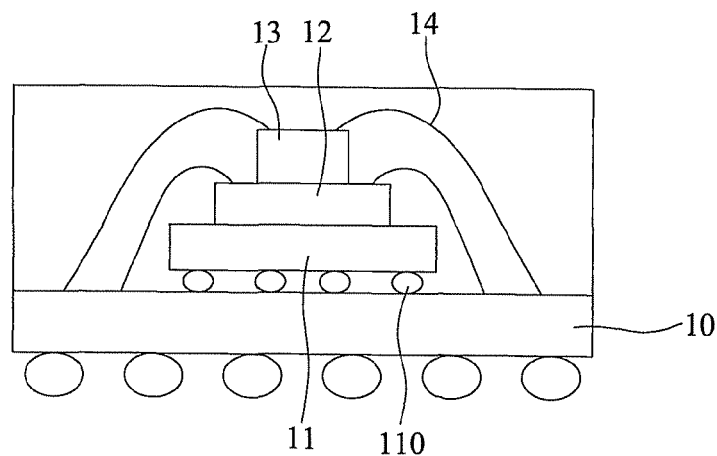
FIG. 1 is a cross-sectional view of a stack package structure having a plurality of semiconductor chips according to the prior art.
Figure 2A:
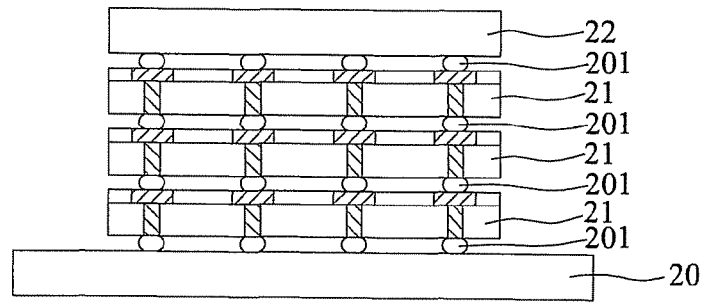
Figure 2B:
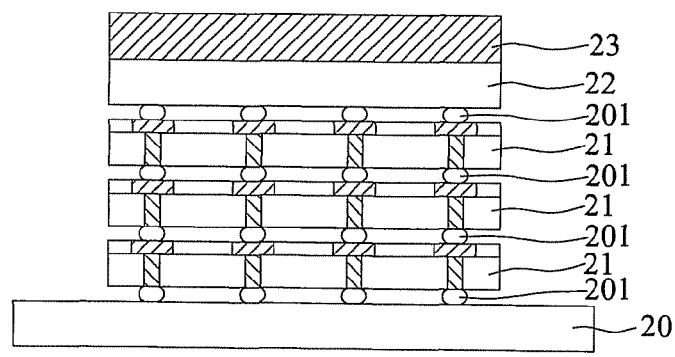
Figure 3D:
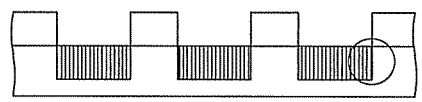
Figures 1, 3D:
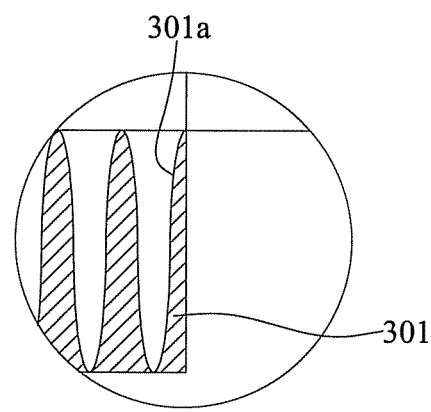

As shown in FIGS. 3D and 3D-1, the oxidative blocks 301 are etched in a dry or wet etching process, so as to form a plurality of nano apertures 301a in each of the oxidative blocks 301.

Figure 3E:
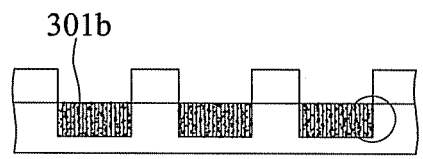
Figures 1, 3E:
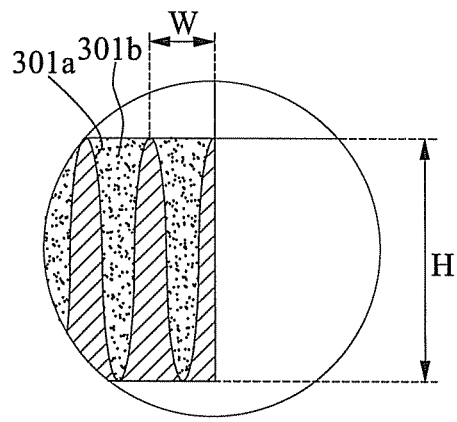

As shown in FIGS. 3E and 3E-1, nano wires 301b are deposited in the nano apertures 301a in an electroplated or chemical deposition process. In physics, the nano wires 301b are defined having a traverse length less than 100 nano meters (without limitation in longitudinal length). In an embodiment of the present invention, each of the nano wires 301b has a width less than or equal to 100 nano meters, or has an aspect ratio greater than 1000. The nano wires 301b are made of metal, such as copper, nickel, platinum or gold.

Figure 3F:
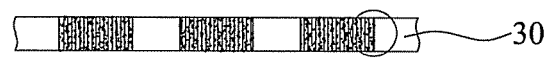
Figures 1, 3F:
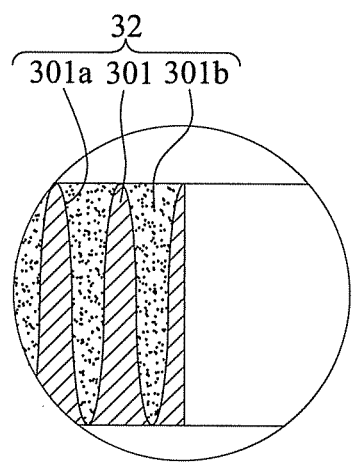

As shown in FIGS. 3F and 3F-1, end surfaces of the oxidative blocks 301 and the nano wires 301b are exposed from the metal board body 30, so as to form conductive through holes 32. In practice, the conductive through holes 32 are made by polishing or etching a surface of the metal board body 30 that opposes the surface of the metal board body 30 on which the resist layer 31 is formed, i.e., removing a surface of the metal board body 30 on which the resist layer 31 is not formed, so as to expose the oxidative block 301 and the nano wires 301b and form the conductive through holes 32. Another embodiment of the method according to the present invention further comprises, before exposing the oxidative blocks 301 and the nano wires 301b, removing the resist layer 31. For example, as shown in FIG. 3E (with reference to FIG. 3B), the resist layer 31 is removed before the end surfaces of the oxidative block 301 and the nano wires 301b are exposed from the metal board body 30, or after the metal board body 30 is polished or etched.

Figure 3G:
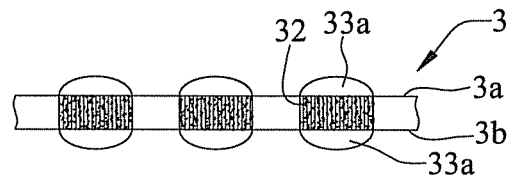

As shown in FIG. 3G, a plurality of first bumps 33a such as bumps made of solder, are formed on end surfaces of the conductive through holes 32, such that the first bumps 33a are formed on both end surfaces of the conductive through holes 32. Copper pillars may be formed on the end surfaces of the conductive through holes 32 before the formation of the conductive through holes 32.

According to the embodiments of the above method, the present invention provides an inner-layer heat-dissipating board, comprising: a metal board body 30 made of aluminum, for example; a plurality of conductive through holes 32 penetrating the top and bottom surfaces of the metal board body 30, each of the conductive through holes 32 including a plurality of nano wires 301b and an oxidative block 301 having a plurality of nano apertures 301a filled with the nano wires 301b.

In an embodiment of the present invention, the inner-layer heat-dissipating board may further comprise a plurality of first bumps 33a disposed on end surfaces of the conductive through holes 32.

Figure 3H:
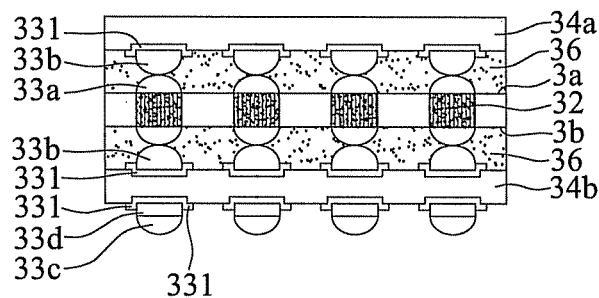
Figure 3I:
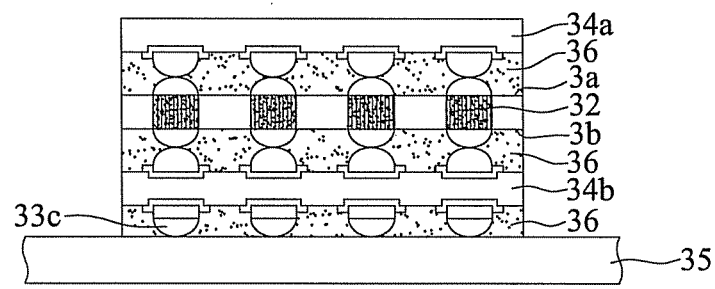
Figure 3I:
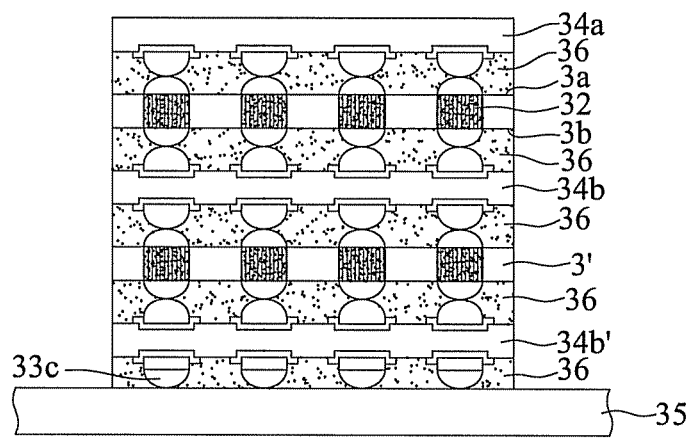

Referring to FIGS. 3H to 3I, a method of fabricating a multi-chip stack package structure is shown having the inner-layer heat-dissipating board 3.

As shown in FIG. 3H, a first chip 34a and an electronic component such as a second chip 34b are disposed on a first surface 3a and a second surface 3b of the inner-layer heat-dissipating board, respectively. The electronic component is not limited to be the second chip, and may be a circuit board. The first and second chips 34a and 34b may have a TSV design, or comprise circuits disposed on top and bottom surfaces thereof that are electrically connected to the conductive through holes 32. In an embodiment of the present invention, the first chip 34a and the second chip 34b may be electrically connected to the first bumps 33a disposed on the end surfaces of the conductive through holes 32 of the inner-layer heat-dissipating board 3 through conductive elements such as solder balls. The conductive elements may comprise metal pillars and metal bumps formed on the metal pillar that are made of solder balls, such as metal pillars 33d formed on electrode pads 331 on a bottom surface of the second chip 34b and third bumps 33c formed on the metal pillar 33d. Of course, the conductive elements have a structure that may be applied to other chips or inner-layer heat-dissipating boards. In general, corresponding electrode pads 331 are formed on surfaces of two chips disposed on the first and second surfaces 3a and 3b of the inner-layer heat-dissipating board 3, respectively. For instance, the electrode pads 331 are disposed on a bottom surface of the first chip 34a and electrically connected to the conductive through holes 32 of the inner-layer heat-dissipating board 3; the electrode pads 331 are disposed on a top surface of the second chip 34b and electrically connected to the conductive through holes 32 of the inner-layer heat-dissipating board 3; and the electronic pads 331 disposed on the bottom surface of the second chip 34b may be disposed with and electrically connected to other inner-layer heat-dissipating board or electronic components, such as circuit boards or chips. The inner-layer heat-dissipating board 3 may provide a fast heat-dissipating path in the multi-chip stack structure, to overcome the drawback that heat-dissipating efficiency is reduced due to the disposition of the chips in the middle of the stack. Moreover, the present invention takes a metal board body having oxidative blocks as an inner-layer heat-dissipating board, such that the multi-chip stack package structure has an increased overall structural rigidity, reducing the risk of the multi-chip stack package structure from being damaged.

An underfill material 36 may be further formed between the inner-layer heat-dissipating board 3 and the first chip 34a and between the inner-layer heat-dissipating board 3 and the second chip 34b, and may encapsulate the first bumps 33a and the second bumps 33b.

Further, FIGS. 3I and 3I' illustrate, but are not intended to limit, extended stack aspects of a multi-chip stack package structure according to the present invention. As shown in FIG. 3I, the electronic component of the second chip 34b is disposed on the inner-layer heat-dissipating board 3 via the top surface thereof, and the bottom surface of the second chip 34b is stacked on a circuit board 35 through third bumps 33c such as solder balls; or the bottom surface of the second chip 34b is stacked on another inner-layer heat-dissipating board 3', the bottom surface of the inner-layer heat-dissipating board 3' is stacked on another electronic component such as a third chip 34b', and the bottom surface of the third chip 34b' is disposed on the circuit board 35 through third bumps 33c such as solder balls, as shown in FIG. 3I'. In an embodiment of the present invention, the circuit board 35 may be a motherboard or a packaging substrate.

An underfill material 36 may be further formed between the circuit board 35 and the second chip 34b, or between the circuit board 35 and the third chip 34b'; or between the inner-layer heat-dissipating board 3' and the third chip 34b' and the second chip 34b, and may be made of a material the same as or different from the underfill material 36 formed between the inner-layer heat-dissipating board 3 and the first chip 34a and between the inner-layer heat-dissipating board 3 and the second chip 34b.

According to the embodiments of the above method, the present invention also provides a multi-chip stack package structure having an inner-layer heat-dissipating board, comprising: an inner-layer heat-dissipating board 3 including a metal board body 30 and a plurality of conductive through holes 32 penetrating the metal board body 30, each of the conductive through holes 32 including a plurality of nano wires 301b and an oxidative block 301 having a plurality of nano apertures 301a filled with the nano wires 301b; a first chip 34a disposed on a first surface 3a of the inner-layer heat-dissipating board 3; and an electronic component such as a second chip 34b disposed on a second surface 3b of the inner-layer heat-dissipating board 3, and electrically connecting the first chip 34a and the second chip 34b to the conductive through holes, the first surface 3a opposing the second surface 3b.

In an embodiment of the present invention, the metal board body 30 is made of aluminum, and the oxidative block 301 is made of aluminum oxide.

In an embodiment of the present invention, the inner-layer heat-dissipating board 3 further comprises a plurality of first bumps 33a disposed on end surfaces of the conductive through holes 32. The first chip 34a and the second chip 34b have a plurality of second bumps 33b disposed thereon that are electrically connected to the first bumps 33a on end surfaces of the conductive through holes 32 of the inner-layer heat-dissipating board 3. Moreover, if the top surface of the electronic component of the second chip 34b is disposed on the inner-layer heat-dissipating board 3, the multi-chip stack package structure may further comprise a circuit board 35 disposed on a bottom surface of the second chip 34b.

The multi-chip stack package structure further comprises an underfill material 36 formed between the inner-layer heat-dissipating board 3 and the first chip 34a, between the inner-layer heat-dissipating board 3 and the second chip 34b and between the circuit board 35 and the second chip 34b, and encapsulates the first bumps 33a and the second bumps 33b.

Alternatively, if the top surface of the electronic component of the second chip 34b is disposed on the inner-layer heat-dissipating board 3, and the bottom surface of the second chip 34b is stacked on another inner-layer heat-dissipating board 3', another electronic component such as a third chip 34b' may be disposed on the bottom surface of the inner-layer heat-dissipating board 3', and third bumps 33c such as solder balls are disposed on the bottom surface of the third chip 34b' and on the circuit board 35. The circuit board 35 may be a motherboard or a packaging substrate In an inner-layer heat-dissipating board, a multi-chip stack package structure having the inner-layer heat-dissipating board and a fabrication method thereof according to the present invention, an inner-layer heat-dissipating board is provided that has a plurality of conductive through holes filled with nano wires, and chips are disposed on two surfaces of the inner-layer heat-dissipating board and electrically connected to the conductive through holes, such that the stacked chips sandwich the inner-layer heat-dissipating board, and the inner-layer heat-dissipating board provides a fast heat-dissipating path for the chips disposed in the middle of the stack. Therefore, the problem of poor heat-dissipating efficiency is improved. In the present invention, a metal board body having oxidative blocks is used as a heat-dissipating board. Accordingly, the multi-chip stack package structure has an enhanced overall rigidity, and has a reduced risk of being damaged.

The foregoing descriptions of the detailed embodiments are illustrated to disclose the features and functions of the present invention and are not intended to be restrictive of the scope of the present invention. It should be understood to those in the art that all modifications and variations made according to the spirit and principles in the disclosure of the present invention will fall within the scope of the appended claims.

What is claimed is:

1. An inner-layer heat-dissipating board, comprising:
a metal board body; and
a plurality of conductive through holes penetrating the metal board body, each of the conductive through holes including a plurality of nano wires and an oxidative block having a plurality of nano apertures filled with the nano wires.

2. The inner-layer heat-dissipating board of claim 1, wherein the metal board body is made of aluminum, and the oxidative block is made of aluminum oxide.

3. The inner-layer heat-dissipating board of claim 1, further comprising a plurality of first bumps disposed on end surfaces of the conductive through holes.

4. The inner-layer heat-dissipating board of claim 1, wherein each of the nano wires has a width less than or equal to 100 nano meters, or has an aspect ratio greater than 1000.

5. The inner-layer heat-dissipating board of claim 1, wherein the nano wires are made of copper, nickel, platinum or gold.

6. A multi-chip stack package structure, comprising:
an inner-layer heat-dissipating board including a metal board body and a plurality of conductive through holes penetrating the metal board body, each of the conductive through holes including a plurality of nano wires and an oxidative block having a plurality of nano apertures filled with the nano wires;
a first chip disposed on a first surface of the inner-layer heat-dissipating board; and
an electronic component disposed on a second surface of the inner-layer heat-dissipating board, the second surface opposing the first surface.

7. The multi-chip stack package structure of claim 6, wherein the metal board body is made of aluminum, and the oxidative block is made of aluminum oxide.

8. The multi-chip stack package structure of claim 6, wherein the inner-layer heat-dissipating board further comprises a plurality of first bumps disposed on end surfaces of the conductive through holes.

9. The multi-chip stack package structure of claim 8, further comprising a plurality of second bumps disposed on the first chip and the electronic component that are electrically connected to the first bumps via the second bumps.

10. The multi-chip stack package structure of claim 6, wherein the electronic component is a circuit board or a second chip.

11. The multi-chip stack package structure of claim 10, wherein the electronic component is the second chip, the second chip is disposed on the inner-layer heat-dissipating board via a top surface thereof, and the multi-chip stack package structure further comprises a circuit board disposed under a bottom surface of the second chip.

12. The multi-chip stack package structure of claim 11, further comprising an underfill material formed between the inner-layer heat-dissipating board and the first chip, between the inner-layer heat-dissipating board and the second chip, and between the circuit board and the second chip.

13. The multi-chip stack package structure of claim 6, further comprising another inner-layer heat-dissipating board stacked under a bottom surface of the electronic component.

14. The multi-chip stack package structure of claim 6, wherein each of the nano wires has a width less than or equal to 100 nano meters, or has an aspect ratio greater than 1000.

15. The multi-chip stack package structure of claim 6, wherein the nano wires are made of copper, nickel, platinum or gold.

* * * * *